United States Patent
Roudot et al.

(10) Patent No.: US 6,796,846 B2
(45) Date of Patent: Sep. 28, 2004

(54) EQUIPMENT ASSEMBLY FOR MOTOR VEHICLE COMPRISING IMPROVED ELECTRICAL CONNECTION MEANS

(75) Inventors: Jean-Luc Roudot, Seloncourt (FR); Denis Bocquet, Essert (FR); Christian Henigue, Audincourt (FR)

(73) Assignee: Faurecia Industries, Nanterre (FR)

( * ) Notice: Subject to any disclaimer, the term of this patent is extended or adjusted under 35 U.S.C. 154(b) by 0 days.

(21) Appl. No.: 10/412,316

(22) Filed: Apr. 14, 2003

(65) Prior Publication Data

US 2003/0194911 A1 Oct. 16, 2003

(30) Foreign Application Priority Data

Apr. 16, 2002 (FR) .............................................. 02 04743

(51) Int. Cl.$^7$ .......................................... H01R 13/625
(52) U.S. Cl. ..................................................... 439/674
(58) Field of Search ........................... 439/674, 34, 374, 439/680, 677

(56) References Cited

U.S. PATENT DOCUMENTS

| | | | | |
|---|---|---|---|---|
| 4,284,311 A | * | 8/1981 | Forster et al. ................. | 439/34 |
| 4,943,241 A | * | 7/1990 | Watanabe et al. ............. | 439/34 |
| 5,353,190 A | * | 10/1994 | Nakayama et al. .......... | 361/647 |
| 5,487,680 A | * | 1/1996 | Yamanashi ................... | 439/552 |
| 5,651,683 A | * | 7/1997 | Shimamura et al. .......... | 439/34 |
| 5,836,787 A | | 11/1998 | Kodama ...................... | 439/567 |
| 6,062,888 A | * | 5/2000 | Takiguchi ................... | 439/248 |
| 6,065,988 A | * | 5/2000 | Kubota ........................ | 439/329 |
| 6,095,855 A | * | 8/2000 | Iwata et al. ................. | 439/553 |
| 6,280,228 B1 | * | 8/2001 | Maciejewski et al. ....... | 439/374 |
| 6,302,744 B1 | * | 10/2001 | Nomura ...................... | 439/680 |
| 6,319,045 B1 | * | 11/2001 | Sawayanagi et al. ........ | 439/374 |
| 6,343,939 B1 | * | 2/2002 | Inoue .......................... | 439/34 |
| 6,352,433 B2 | * | 3/2002 | Hayashi ...................... | 439/34 |
| 6,402,565 B1 | * | 6/2002 | Pooley et al. ............... | 439/680 |

FOREIGN PATENT DOCUMENTS

| | | |
|---|---|---|
| EP | 0 800 237 | 10/1997 |
| FR | 2 436 685 | 4/1980 |

* cited by examiner

Primary Examiner—Tulsidas C. Patel
(74) Attorney, Agent, or Firm—Young & Thompson

(57) ABSTRACT

This assembly comprises a first electrical connection part mounted on a first piece of equipment, the first piece of equipment comprising a first guiding and positioning member for the first electrical connection part, a second piece of equipment comprising a second guiding and positioning member complementary to the first one and permitting relative guiding and positioning of the second piece of equipment on the first one, and a second electrical connection part complementary to the first one, mounted on the second piece of equipment. The second electrical connection part is mounted on the piece of equipment with a clearance in one direction orthogonal to the assembly direction, and comprises a third guiding and positioning member complementary to the first one.

12 Claims, 5 Drawing Sheets

EQUIPMENT ASSEMBLY FOR MOTOR VEHICLE COMPRISING IMPROVED ELECTRICAL CONNECTION MEANS

TECHNICAL FIELD

The invention relates to the field of equipment for motor vehicles.

In particular, the invention relates to an equipment assembly for a motor vehicle comprising

- a first electrical connection part mounted on a first piece of equipment, the first piece of equipment comprising a first guiding and positioning member permitting relative guiding in one assembly direction and positioning of the first electrical connection part on the first piece of equipment,
- a second piece of electrical equipment comprising a second guiding and positioning member complementary to the first one and permitting relative guiding and positioning of the second piece of equipment on the first piece of equipment,
- a second electrical connection part complementary to the first one, mounted on the second piece of equipment.

BACKGROUND TO THE INVENTION

The mounting of an item of equipment having electrical connections on another item of equipment already fixed or pre-positioned on the vehicle poses considerable problems of manipulation and necessitates operations which are difficult to automate. For example, the installation of an instrument panel, which includes electrically supplied displays, on the dashboard, this latter being already in place inside the vehicle, is generally carried out in the following manner: via the interior of the vehicle the operator approaches the instrument panel which has an electrical connection housing on its rear face, grips the other connector part wired through the interior of the cavity of the dashboard provided to receive the instrument panel; he must then carry out the assembly of the connectors whilst keeping the instrument panel close to the receiving cavity or to the interior thereof, the cable having an excess length with respect to the assembled position of the instrument panel in the dashboard.

This manipulation is not only complex but also is not compatible with the implementation of a carmated assembly process, and consequently it constitutes a major obstacle to achieving productivity gains.

A principal aim of the invention is to render assembly operations of the type described above less tiresome and more simple for an operator, even to make it possible to automate the operation, and to compensate automatically during the installation for the play in the relative positioning of the connection pieces.

SUMMARY OF THE INVENTION

To this end, according to the invention, the second electrical connection part is mounted on the corresponding piece of equipment with a clearance in at least one direction substantially orthogonal to the assembly direction, and comprises a third guiding and positioning member complementary to the first one, such that the first guiding and positioning member defines a unique reference for relative positioning of the pieces of equipment and for relative positioning of the first and second connection parts.

According to other characteristics of the invention:

- the second connection part is mounted on the second piece of equipment with a clearance in two directions substantially orthogonal to the assembly direction;
- the clearance in at least one direction substantially orthogonal to the assembly direction is greater than 1.5 mm, preferably of the order of 2 mm;
- the equipment assembly has resilient means for stressing the second connection part towards a neutral position with respect to the second piece of equipment, acting in at least one direction of clearance;
- the guiding and positioning members of the second piece of equipment and of the second connection part on the one hand and the guiding and positioning member of the first piece of equipment on the other hand are complementary rails extending in a substantially rectilinear manner along the direction of coupling of the connection parts;
- the rail of the second connection part extends substantially in the extension of the rail of the second piece of equipment;
- the second connection part is rigidly joined to a printed circuit board which is itself mounted with a clearance on the corresponding piece of equipment;
- the said board is a visible part which can be seen from the interior of the vehicle when the assembly is mounted on the vehicle; and
- at least one of the connections parts is a housing in which contacts are located.

According to a first embodiment of the invention, the two connection parts are housings which are complementary to one another, in each of which are accommodated the respective contacts which are complementary to those accommodated in the other part of the connection housing.

According to a second embodiment of the invention, one of the connection parts is a housing in which are accommodated contacts of the butt contact type, whilst the other connection part comprises conductive surfaces formed on the printed circuit board, the said surfaces having the said butt-type contacts resting on them.

According to this embodiment the third means of guiding and positioning is directly formed in the printed circuit board.

As will be shown below, the invention applies more particularly to the fixing of an item of electrical equipment on a dashboard, a door panel, a central console, a seat or even a horn.

The item of electrical equipment may consist, as has already been mentioned, of an instrument panel, but may also be a car radio, a control console or a display.

BRIEF DESCRIPTION OF DRAWINGS

Embodiments of the invention will now be explained with reference to the accompanying drawings, in which.

DESCRIPTION OF PREFERRED EMBODIMENTS

In all the following, the description will be given with reference to the system of axes X, Y, Z represented in FIG. 1, in which the axis X—X corresponds to the longitudinal axis of the vehicle (horizontal) oriented towards the front, the axis Y—Y corresponds to the transverse axis (horizontal) oriented from right to left, and the axis Z—Z is the vertical axis oriented upwards from below.

Figure 1:
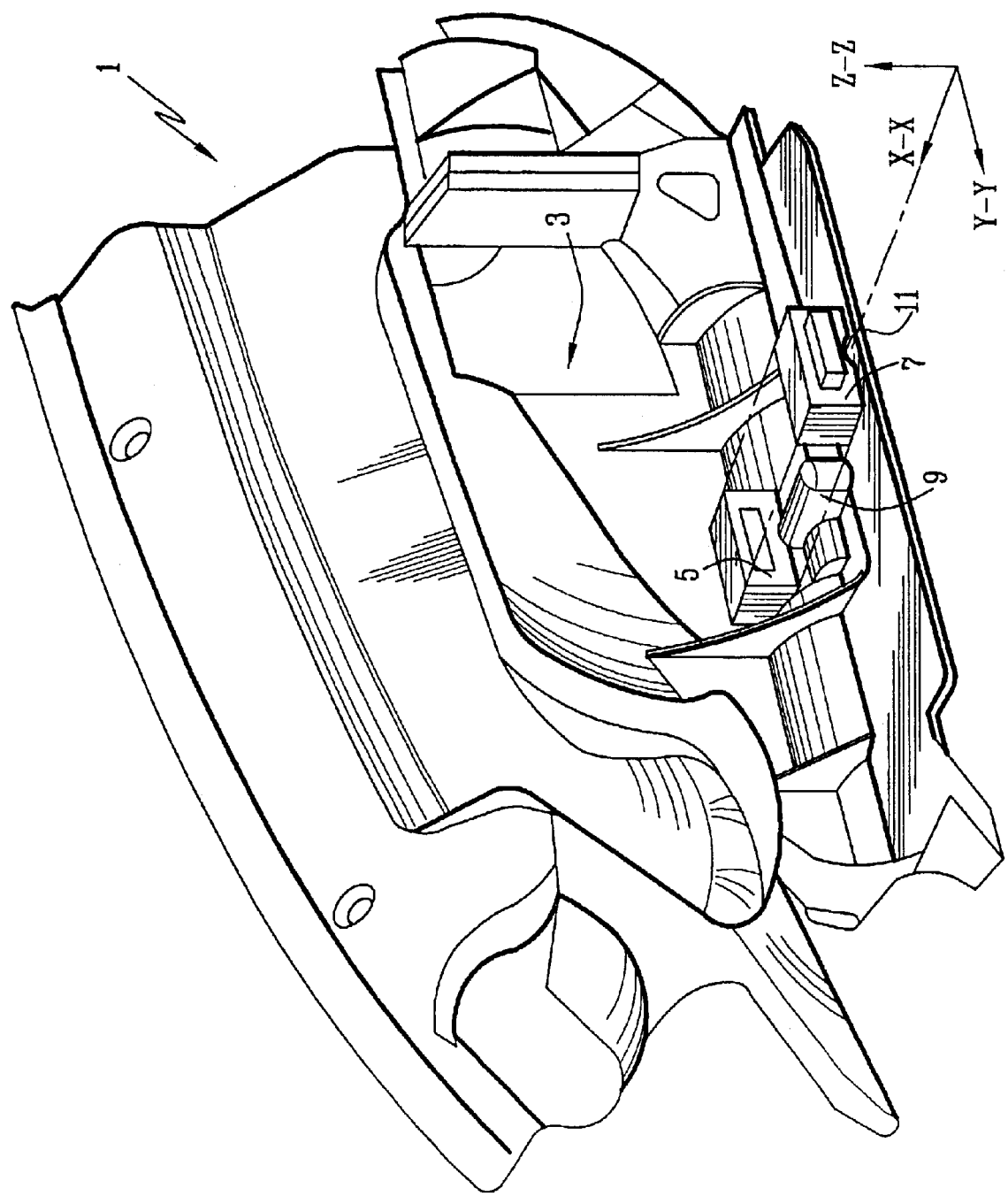
FIG. 1 is a schematic perspective view from the interior of a vehicle of a dashboard and an associated connector part according to a first embodiment of the invention, the two parts being shown separated.

In FIG. 1, a part of a dashboard 1 is shown in which a cavity 3 is provided. The dashboard 1 constitutes a first piece of equipment fixed in the interior of the vehicle and intended to receive in its cavity 3 a second piece of equipment constituted by an instrument panel which will be described with reference to FIG. 2.

On the dashboard 1, in a lower part of the cavity 3, there is formed a block 5 for receiving and fixing a male electrical connector 7. The male electrical connector 7 is shown alone, it being understood that in the illustrated configuration it is in reality wired. The bundle of cables connected to the male electrical connector 7 is not shown, and runs in a conventional manner from the engine compartment to the connector 7, which for its part is placed in the passenger compartment, passing through the cavity 3. The bundle of cables could equally come from the dashboard 1 itself.

The receiving and fixing block 5 comprises means of a conventional type for fixing the male electrical connector 7, for example means for snap-fitting, screwing, crimping or others; therefore these fixing means have not been shown.

A rail 9 moulded integrally with the dashboard 1 extends, in the illustrated example, along the longitudinal axis X—X which will define the axis of assembly of the connection parts on the pieces of equipment, and the axis of coupling of the connection parts to one another. It goes without saying that this reference axis has been chosen arbitrarily, and that depending upon the nature of the equipment and its location in the vehicle, any other axis would be appropriate to the illustration of the invention.

The rail 9 has a cross-section in the shape of an inverted U and co-operates with a groove 11 of complementary shape which opens on a lower face of the male electrical connector 7. The rail 9 constitutes a guiding and positioning member for the male electrical connector 7 with respect to the dashboard 1 and in particular with respect to the cavity 3. By co-operation of the groove 11 with the rail 9 the male electrical connector 7 is guided, when it is fixed on the dashboard 1, longitudinally as far as the block 5 and positions it precisely with respect thereto.

Figure 2:
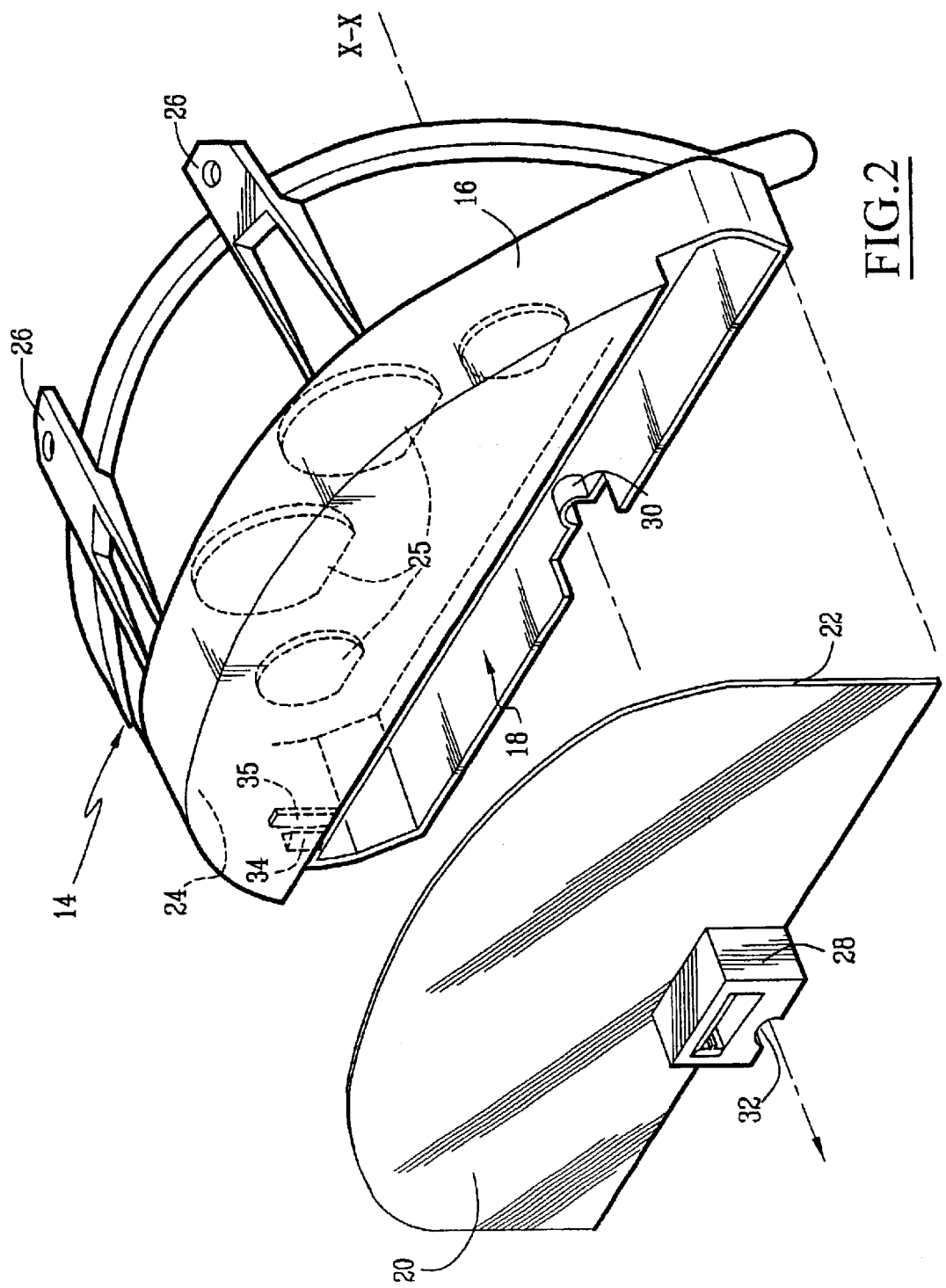
FIG. 2 is an analogous view of an instrument panel and an associated connector part.

With reference to FIG. 2, the second piece of equipment will now be described which consists of an instrument panel 14 with an external shape complementary to that of the cavity 3.

The instrument panel 14 has for example electrical displays, screens, which are not visible on the drawing because the instrument panel 14 is oriented so as to reveal its part intended to co-operate with the cavity 3 of the dashboard 1.

On this side the instrument panel 14 has a flange 16 delimiting a receptacle 18. This receptacle 18 receives a back plate 20 of which the outer edges 22 are provided so as to coincide, at least partially, with the internal surface 24 of the flange 16.

The back plate 20 is formed by a printed circuit on which the face turned towards the interior of the vehicle supports illuminated indicators, screens or other displays, and thus it constitutes a part which is visible to a use positioned in the passenger compartment of the vehicle. These illuminated indicators, screens, displays, etc., are visible from the interior of the vehicle through the windows 25 with respect to which they must be positioned relatively precisely. It is therefore important that the back plate 20 should be positioned relatively precisely in the receptacle 18.

Conventional members 26 for fixing the instrument panel 14 on the dashboard 1 are disposed on the outer periphery of the instrument panel 14.

The back plate 20 is joined to a female electrical connector 28 which is complementary to the male electrical connector 7 fixed on the dashboard 1.

A rectilinear rail 30 extending along the longitudinal axis of the vehicle X—X is formed on a lower internal face of the flange 16 of the instrument panel 14. The rail 30 constitutes a second guiding and positioning member and has a cross-section in the shape of an inverted U, the lower hollow part of which is complementary to the rail 9. A groove 32 formed on a lower face of the female electrical connector 28 constitutes a third positioning and guiding member (or rail), equally complementary to the rail 9.

The assembly formed by the female connector 28 and the back plate 20 is locked in axial position by resiliently deformable lugs 34 disposed on the internal edges 24 of the flange 16 and co-operating with the external edges 22 of the back plate 20, as well as by axial stops 35.

Once the plate 20 is fixed on the instrument panel 14, as indicated previously, the groove 32 of the female connector 28 extends substantially in the extension of the rail 30 of the instrument panel, by butting of the rail 30 and groove 32.

The plate 20 is capable of undergoing slight transverse displacements with respect to the instrument panel 14 from the neutral position thus defined.

Therefore the plate 20 has a clearance in at least one direction, preferably two directions Y—Y, Z—Z, substantially orthogonal to the direction of installation X—X in the receptacle 18.

For example, the transverse clearance along the axis Y—Y can be greater than 1.5 mm, of the order of 2 mm.

The transverse clearance along the vertical axis Z—Z can be of the order of 0.5 mm.

In order to restore the plate 20 to its neutral position centred with respect to the receptacle 18, resilient members 33 are provided (FIGS. 3A and 3B), of which the stressing action is oriented essentially in the direction of the clearance between the external edges 22 of the back plate 20 and the internal edges 24 of the flange 16. These restoring resilient members 33 can be formed by tabs projecting from the flange 16 towards the edges 22. In the illustrated example, such a tab 33 acting in the direction of the vertical clearance of the plate 20, stresses the latter downwards by pressing its lower edge onto the rail 9.

Figure 3A:
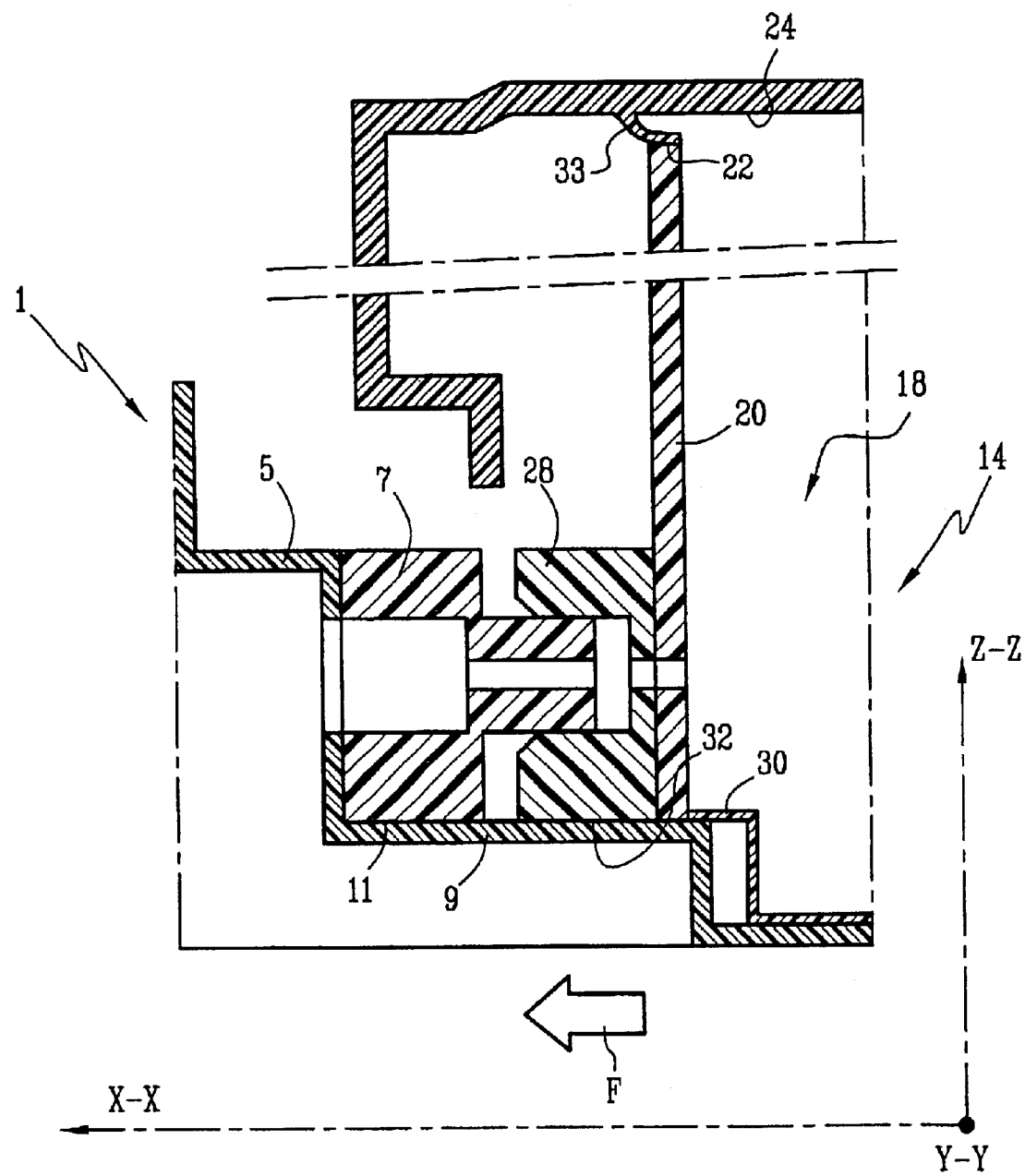
FIG. 3A is a sectional view in a median plane of the connectors passing through the longitudinal axis of the guiding rails of the assembly formed by the parts shown in the preceding figures, the dashboard as well as the instrument panel being provided with their respective connectors, in pre-assembled position.
Figure 3B:
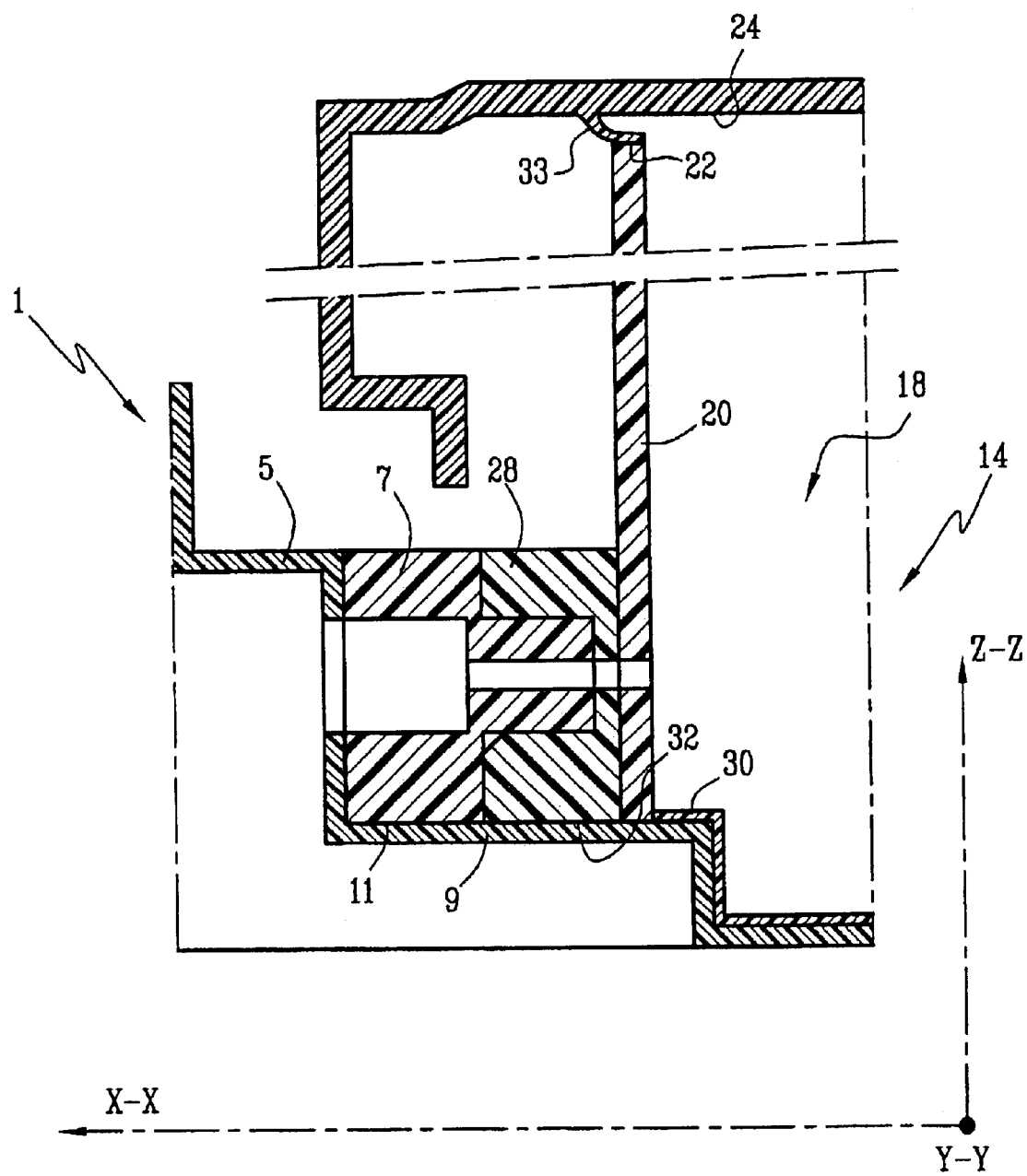
FIG. 3B is an analogous view in the assembled position of the dashboard and the instrument panel.

FIGS. 3A and 3B show each of the sub-assemblies formed on the one hand by the dashboard 1 and the associated male electrical connector 7 and on the other hand by the instrument panel 14 and the female electrical connector 28 (and jointly the back plate 20), each of the sub-assemblies being in the assembled position.

FIG. 3A shows the two sub-assemblies facing one another, in a pre-assembled position, such that it will be understood that the rail 30, by its lower surface, and the groove 32 are adapted to co-operate with the rail 9. In fact, the assembled sub-assembly formed by the instrument panel 14, the female connector 28 and the back plate 20 can slide on the rail 9 as far as the position of complete insertion of the instrument panel 14 in the cavity 3 on the one hand and of the male electrical connector 7 in the female electrical connector 28 on the other hand.

In order to place the assembly in its completely assembled position, as shown in FIG. 3B, it is sufficient to push the part 14 according to the arrow F until the connector parts 7, 28 are completely coupled.

Figure 4:
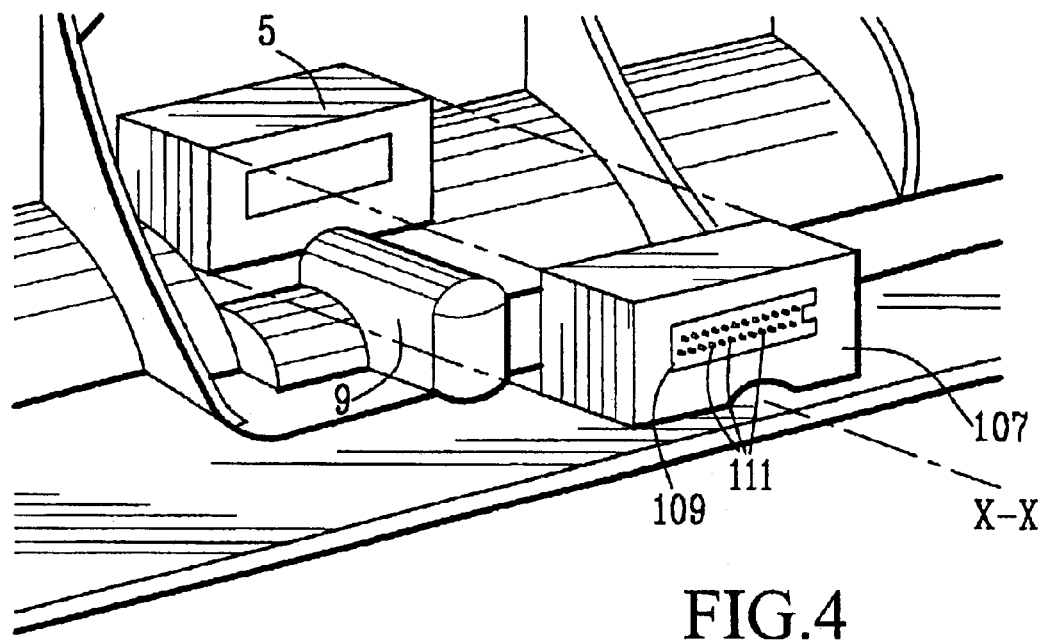
FIG. 4 is an enlarged detail, in the region of the guiding rail, of a part of the dashboard of FIG. 1 and an associated connector part according to a second embodiment of the invention.

With reference to FIG. 4, a second embodiment of the invention will now be described in which a so-called "butt" connection is substituted for the "male/female"-type connector which was the subject of the first embodiment of the invention described with reference to FIGS. 1 to 3 (3A and 3B).

In this FIG. 4 the only part of the dashboard which is shown, on a larger scale than that of FIG. 1, is the region comprising the fixing block 5 and the guiding rail 9.

The connection part 107 intended to become fixed on the block 5 is formed by a housing in which a contact support module 109 is accommodated. Contacts 111 are inserted and retained in the contact support module 109, the said contacts 111 being of the "butt" type, that is to say that they are provided to co-operate with a conductive surface by bearing upon the latter. For this, the contacts 111 are mounted in the contact support module 109 in such a way as to go slightly beyond the said contact support module 109 in the direction of the other connection part, the two connection parts being, when they are coupled, held together by an adapted clamping force.

Figure 5:
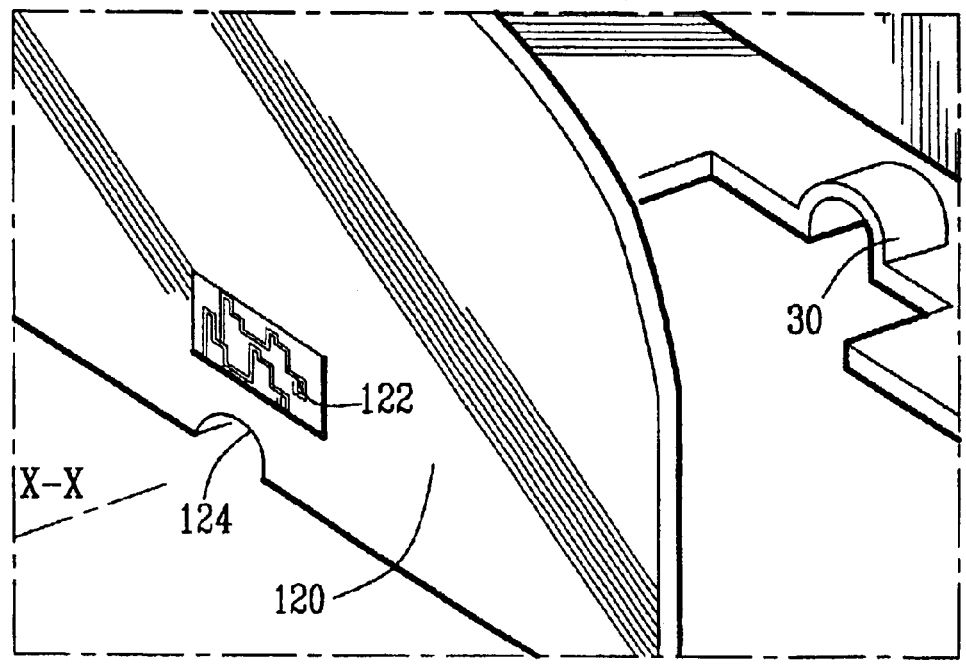
FIG. 5 is an analogous view of a part of a dashboard and an associated printed circuit board part according to the second embodiment of the invention.

The other connection part associated with the first part 107 will now be described briefly with reference to FIG. 5.

This figure also shows an instrument panel of the type shown in FIG. 2, in its region comprising the guide rail 30. The second connection part associated with the first part 107 is formed essentially by conductive tracks 122 which are intended to have the butt contacts 111 resting on them and are formed on a printed circuit board 120 analogous to the board 20 of the first embodiment.

The means for mutual locking and clamping of the two connection parts 107, 122 have not been shown, but it will be understood that they may be of any adapted type, acting directly or indirectly on the connection parts 107, 122.

A complementary form of guiding 124 of the rail 9 is made directly in the printed circuit board 102 with the configuration of a groove complementary to the rail 9.

This second embodiment shows that the invention does not have to be limited to the most common type of connection in which the two complementary connection parts are formed by a male connector and a female connector. On the contrary, the invention is designed for numerous types of connectors and items of equipment for vehicles.

Thus it will be appreciated that the guiding and positioning member 30 not only permits the electrical connection part 28; 122 to be positioned with relative precision on the associated piece of equipment 14, but also makes it possible to ensure a precise positioning of the connection parts 7, 28; 107, 122 with respect to one another, and simultaneously of the pieces of equipment 1, 14 with respect to one another.

The mounting of one of the connection parts with a clearance on its piece of equipment makes it possible to guarantee not only a reliable electrical connection but also that the clearances between and the levelling of the different pieces are respected.

This positioning is achieved with respect to one single reference constituted by the rail 9 since all the parts of the assembly are centred thereon. The result of this is a simultaneous solution, using common means and with a small number of parts, to the problems of positioning of the pieces of equipment with respect to one another, which has a major impact on the appearance of the interior of the vehicle, and the problems of alignment of the connector parts before they are coupled.

What is claimed is:

1. An equipment assembly for a motor vehicle, comprising:
a first piece of equipment and a second piece of equipment that is be assembled to the first piece of equipment;
a first electrical connection part and a second electrical connection part that is to be assembled to the first electrical connection part;
the first electrical connection part being mounted on the first piece of equipment, the first piece of equipment comprising a first guiding and positioning member permitting relative guiding in one assembly direction and positioning of the first electrical connection part on the first piece of equipment;
the second piece of equipment comprising a second guiding and positioning member complementary to the first guiding and positioning member and permitting relative guiding and positioning of the second piece of equipment on the first piece of equipment; and
the second electrical connection part being complementary to the first electrical connection part and being mounted on the second piece of equipment, with a clearance in at least one direction substantially orthogonal to an assembly direction, the second electrical connection part comprising a third guiding and positioning member complementary to the first guiding and positioning member,
the second and third guiding and positioning members engaging the first guiding and positioning member during mating of the first and second electrical connection parts and during relative positioning of the first and second pieces of equipment such that the first guiding and positioning member defines a unique reference for relative positioning of the first and second pieces of equipment and for relative positioning of the first and second electrical connection parts.

2. The assembly as claimed in claim 1, wherein the second connection part is mounted on the second piece of equipment with a clearance in two directions substantially orthogonal to the assembly direction.

3. The assembly as claimed in claim 1, wherein the clearance in at least one direction substantially orthogonal to the assembly direction is greater than 1.5 mm.

4. The assembly as claimed in claim 1, the second piece of equipment comprising resilient means for stressing the second connection part towards a neutral position with respect to the second piece of equipment, acting in at least one direction of clearance.

5. The assembly as claimed in claim 1, wherein the second and third guiding and positioning members and the first guiding and positioning member are complementary rails and grooves extending in a substantially rectilinear manner along the direction of coupling of the first and second electrical connection parts.

6. The assembly as claimed in claim 5, wherein the groove of the second electrical connection part extends substantially in the extension of the rail of the second piece of equipment.

7. The assembly as claimed in claim 1, wherein the second electrical connection part is rigidly joined to a printed circuit board which is itself mounted with a clearance on the second piece of equipment.

8. The assembly as claimed in claim 7, wherein said board is a visible part which can be seen from the interior of the vehicle when the assembly is mounted on the vehicle.

9. The assembly as claimed in claim 1, wherein at least one of the first and second electrical connection parts is a housing in which contacts are located.

10. The assembly as claimed in claim 9, wherein the first and second electrical connection parts are housings which are complementary to one another, in each of which are accommodated the respective contacts which are complementary to those accommodated in the other part of the connection housing.

11. The assembly as claimed in claim 7, wherein at least one of the first and second electrical connection parts is a housing in which contacts are located, the housing accommodating butt-contact contacts, whilst the other of the electrical connection parts comprises conductive surfaces formed on the printed circuit board, said surfaces having said butt-type contacts resting on them.

12. The assembly as claimed in claim 11, wherein the third guiding and positioning member is directly formed in the one of the electrical connection parts corresponding to the printed circuit board.

* * * * *